(12) United States Patent
Biber

(10) Patent No.: US 9,057,768 B2
(45) Date of Patent: Jun. 16, 2015

(54) LOCAL COIL FOR A MAGNETIC RESONANCE DEVICE

(75) Inventor: Stephan Biber, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 556 days.

(21) Appl. No.: 13/300,092

(22) Filed: Nov. 18, 2011

(65) Prior Publication Data

US 2012/0299593 A1 Nov. 29, 2012

(30) Foreign Application Priority Data

Nov. 19, 2010 (DE) .......................... 10 2010 044 187

(51) Int. Cl.
*G01R 33/36* (2006.01)
*G01R 33/3415* (2006.01)

(52) U.S. Cl.
CPC ........ *G01R 33/3635* (2013.01); *G01R 33/3415* (2013.01); *G01R 33/3692* (2013.01)

(58) Field of Classification Search
CPC ........... G01R 33/3635; G01R 33/3415; G01R 33/3692
See application file for complete search history.

(56) References Cited

U.S. PATENT DOCUMENTS

| | | | | |
|---|---|---|---|---|
| 4,051,429 A | * | 9/1977 | Imanari et al. | 324/311 |
| 5,038,105 A | * | 8/1991 | Codrington et al. | 324/318 |
| 5,057,778 A | * | 10/1991 | Rath | 324/322 |
| 5,166,621 A | * | 11/1992 | Codrington et al. | 324/322 |
| 5,365,173 A | * | 11/1994 | Zou et al. | 324/318 |
| 5,898,306 A | * | 4/1999 | Liu et al. | 324/322 |
| 6,822,444 B2 | * | 11/2004 | Lai | 324/300 |
| 7,602,187 B2 | | 10/2009 | Luedeke et al. | |
| 7,615,997 B2 | * | 11/2009 | Graesslin et al. | 324/314 |
| 7,733,092 B2 | * | 6/2010 | Otake et al. | 324/322 |
| 8,866,480 B2 | | 10/2014 | Waffenschmidt et al. | |
| 2008/0265890 A1 | | 10/2008 | Graesslin et al. | |
| 2009/0237079 A1 | | 9/2009 | Van Helvoort et al. | |
| 2010/0308826 A1 | | 12/2010 | Saes et al. | |
| 2011/0012598 A1 | | 1/2011 | van Helvoort et al. | |
| 2013/0069652 A1 | * | 3/2013 | Otake et al. | 324/322 |

FOREIGN PATENT DOCUMENTS

| | | |
|---|---|---|
| CN | 101014870(B) | 8/2007 |
| CN | 101088021(A) | 12/2007 |
| CN | 101297213(A) | 10/2008 |
| CN | 101878432(A) | 11/2010 |
| DE | 10 2010 019 058 A1 | 11/2011 |
| DE | 10 2010 028 901 A1 | 11/2011 |
| WO | WO2006067682 A3 | 6/2006 |
| WO | WO2009153727 A3 | 6/2009 |
| WO | WO2009081378 A1 | 7/2009 |

OTHER PUBLICATIONS

German Office Action dated Nov. 22, 2011 for corresponding German Patent Application No. DE 10 2010 044 187.2 with English translation.
André Kurs et al., "Wireless Power Transfer via Strongly Coupled Magnetic Resonances," Science, vol. 317, Jul. 6, 2007, pp. 83-86.
Chinese Office Action, for Corresponding Chinese Patent Application No. 20110344849.7, dated Dec. 2, 2014, with English translation.

* cited by examiner

*Primary Examiner* — Dixomara Vargas
(74) *Attorney, Agent, or Firm* — Lempia Summerfield Katz LLC

(57) ABSTRACT

A local coil for a magnetic resonance device includes a double resonance conductor loop arrangement having at least one conductor loop, and a converter apparatus configured for converting operating energy received at a first resonance frequency into an operating voltage. The local coil also includes an electronics arrangement operated with the operating voltage for processing magnetic resonance signals received at a second resonance frequency.

17 Claims, 5 Drawing Sheets

LOCAL COIL FOR A MAGNETIC RESONANCE DEVICE

This application claims the benefit of DE 10 2010 044 187.2, filed on Nov. 19, 2010.

BACKGROUND

The present embodiments relate to a local coil for a magnetic resonance device.

In magnetic resonance, the use of proximal receiving antennas (e.g., local coils), which may also be embodied for transmission purposes, is known in order to record receiving signals that are spatially close to a patient. After a low-noise preamplification by a low noise amplifier (LNA) and, if necessary, further preprocessing for further evaluation, the recorded signals are wire routed to receive electronics. The receive electronics may form part of a control device, for example. The magnetic resonance signals are evaluated further at the control device, and an image is generated.

A problem with local coils of this type is the cable, where several disadvantages exist. For safety reasons, the cables are provided with shell-type surge blockers in order to avoid burning a patient as a result of high-frequency sheath currents and electrical or thermal coupling with the patient. The cables are also manually tailored to a specific use/a specific magnetic resonance device and therefore also represent an essential factor with regard to price. The cables are disadvantageous in a workflow, since the cables require a measurable part of the time taken for patient preparation. The cables with the shell-type surge blockers that are placed on the patient are perceived as unpleasant and restrictive.

SUMMARY AND DESCRIPTION

Wireless coils are provided. If a wireless transmission of the received magnetic resonance signals is to be realized, and the local coils are to remain completely wireless, a solution for the energy transmission of the energy required for the coil electronics is to be provided in addition to the signal transmission and control of the local coil. The energy transmission is to take place safely for the patient and interference-free for the magnetic resonance imaging. Wireless coils are currently unknown as a product.

The present embodiments may obviate one or more of the drawbacks or limitations in the related art. For example, a local coil that may be wireless with respect to energy transmission may be provided.

In one embodiment, a local coil for a magnetic resonance device includes a double resonance conductor loop arrangement having at least one conductor loop, a converter apparatus for converting operating energy received at a first resonance frequency into an operating voltage, and an electronics arrangement operated with the operating voltage for processing magnetic resonance signals received at a second resonance frequency.

The conductor loop arrangement, which is already present in the case of a local coil, may be embodied such that the conductor loop arrangement includes two resonance frequencies (e.g., a first resonance frequency, at which transmitted energy may be received using a further, external energy transmission coil that is part of the magnetic resonance device, and as a second resonance frequency, the magnetic resonance frequency, at which the magnetic resonance signals are to be received). In order to minimize interferences during the imaging operation, the first resonance frequency is selected at a clear distance from the second resonance frequency so that, for example, the first resonance frequency lies in the range of 1 MHz to 20 MHz (e.g., at 5 MHz). The transmission frequency for the energy supply may be synchronized with a reference clock frequency of the magnetic resonance device in the magnetic resonance device. If the magnetic resonance frequency and the energy transmission frequency are far apart, interference freedom may be realized for the magnetic resonance imaging. The inductive energy transmission provided by resonantly coupled oscillating circuits is basically known in the prior art, with reference being made, for example, to the article "Wireless Power Transfer via Strongly Coupled Magnetic Resonances," Science, Vol. 317, No. 5834, pp. 83-86.

In one embodiment, a transmit device may be provided for the wireless transmission of magnetic resonance signals received at the second resonance frequency. The local coil may be realized completely wirelessly, since the received magnetic resonance signals, because the receive magnetic resonance signals were prepared by a preamplifier (LNA) and, if necessary, a further signal processing, are wirelessly forwarded to receive electronics of the magnetic resonance device. The electronics arrangement may also include an analog-digital converter, so that the signals are digitalized within the local coil. The signals may already be digitally transferred to the receive electronics of the magnetic resonance device using a suitable frequency. The problem of a level dependency on the transmission path existing in the case of analog transmission is avoided. A frequency in the gigahertz range (e.g., between 2 and 100 GHz) may be provided as a transmission frequency for the transmission of the magnetic resonance signals from the transmit device to the receive electronics of the magnetic resonance device. An interference is therefore also avoided.

The local coil may include an energy storage, so that the energy transmission may take place temporally offset with respect to the actual measurement. The energy transmission may take place at the same time as the imaging process. This is possible, since the conductor loop arrangement is embodied with double resonance. The converter apparatus may include a rectifier for generating a direct current from the energy received at the first resonance frequency. The electronic components of the electronics arrangement may be operated at a direct current that may be generated using the rectifier from energy received at the first resonance frequency.

For an embodiment of the double resonance, the at least one conductor loop may include at least one shorting capacitor that has an additional capacitor and a frequency-dependent additional impedance. The frequency-dependent additional impedance features a strong barrier effect at one of the frequencies. The shorting capacitor is connected in parallel to the additional capacitor and the frequency-dependent additional impedance so as to generate the double resonance. For example, four shorting capacitors may be provided in a conductor loop, an additional capacitor and an additional impedance being connected in parallel to each of the four shorting capacitors. Because the additional impedance is frequency-dependent, the additional impedance is therefore dependent on the received frequency, which capacity is actually perceived at which position. With the second resonance frequency (i.e., with the magnetic resonance frequency), only the shorting capacitor is visible for the signal, for example, so that the shorting capacitors determine the tuning to the magnetic resonance frequency. With a lower first resonance frequency, for example, the barrier effect of the additional impedance ceases to apply so that both capacitors that are connected in parallel (e.g., the shorting capacitor and the additional capacitor) are relevant and consequently a different tuning of the at least one conductor loop is provided with the lower first resonance frequency: a detuning to the first resonance frequency, by way of which the energy is transmitted to the local coil. The frequency-dependent additional impedance blocks in the case of the second resonance frequency (e.g., the magnetic resonance frequency) and is approximately negligible in the case of the first resonance frequency (e.g., the energy transmission frequency), so that the additional capacitor may bring the antenna to resonance with the energy transmission frequency.

In another embodiment, the conductor loop arrangement may include at least two conductor loops that overlap one another in an overlap area. Adjacent coil conductors of two adjacent conductor loops are connected in the overlap area by a filter connection. The filter connection includes a connection impedance featuring a strong barrier effect at a second resonance frequency, and a connection capacitor such that a receiving loop that is resonant for the first resonance frequency is formed in the overlap area by the adjacent coil conductor and the filter connection. With a double resonance embodiment of the local coil, if additional capacitors and additional impedances that are connected in parallel are used for each shorting capacitor, increased losses may occur. As a result of the increased losses, the image quality may suffer. Another double resonance conductor loop topology may be used. The antennas for receiving energy may be realized by the overlap region of two conductor loops. Adjacent coil conductors may be connected by way of filters, which only allow the first resonance frequency and not the second resonance frequency to occur. The reduction in losses is consequently realized such that the additional frequency-dependent impedances are not parallel with all shorting capacitors for the double resonance, but may only completely cease to apply or not at all for a shorting capacitor in the coil conductor in the overlap area in each instance. This may also be provided if only two transversely connecting filter connections are actually needed in order to achieve the correct tuning of the receiving loop that is also realized in the overlap area. The overlap areas of different conductor loops, which may be used to decouple adjacent conductor loops at the magnetic resonance frequency, therefore experience an additional usage for receiving energy. The connection impedance is embodied such that the connection impedance blocks for the second resonance frequency (i.e., the magnetic resonance frequency), whereas the connection impedance only shows a small, negligible resistance for the first resonance frequency (i.e., the energy transmission frequency). The overlap is also used to decouple the conductor loops embodied to receive magnetic resonance signals at the first resonance frequency.

In an embodiment, in which the overlap areas are used to form receiving loops, an additional capacitor and a frequency-dependent additional impedance that features a strong barrier effect at one of the frequencies may be connected in parallel in shorting capacitors that are provided in the coil conductors forming the part of the receiving loops. To attune to the first resonance frequency, additional impedances may therefore also be connected in parallel with the shorting capacitors, which are provided in the coil conductors forming a part of the receiving loops. The additional impedances block, for example, with the second resonance frequency (i.e., the magnetic resonance frequency) and represent negligible impedance with the first resonance frequency. A tuning to the first resonance frequency may therefore be achieved in the receiving loop.

An embodiment, in which receiving loops are created in the overlap areas, has an advantage that the receiving loops may be spaced spatially far apart and problems during the decoupling of the antennas with the energy transmission frequency (e.g., with mechanically flexible conductor loops) that may change the geometry may be reduced. The receiving loops may, for example, only be embodied in one part of the overlap areas in the case of at least three overlap areas (e.g., an overlap area without receiving loop is arranged between two receiving loops). This contributes to further interference suppression.

An inductor (e.g., a coil) may be used as an additional impedance and/or connection impedance. However, inductors and/or coils are provided at such points, which either feature a large installation size or higher losses. A parallel resonance circuit with a capacitor and an inductor may be provided as the additional impedance and/or as the connection impedance. The parallel resonance circuit, which is configured as a barrier in the second resonance frequency, enables lower losses to be realized in the first resonance frequency with a smaller installation size and leaves losses relatively uninfluenced in the case of the second magnetic resonance frequency. This is advantageous since high inductance values, as provided for a coil, are only available with significant losses in the case of a smaller design. The inductance of the parallel resonance circuit may have a small value and be embodied as a result as a lower loss design.

In an embodiment, in which conductor loops are used both to receive the first magnetic resonance frequency and the second magnetic resonance frequency, an energy of the first frequency is provided around terminals so as to tap magnetic resonance signals of the protective circuit conducting the second resonance frequency. If the electronics arrangement for processing the magnetic resonance signals (e.g., the low-noise preamplifier (LNA) is exposed to the energy transmission signals, this should be protected from the voltage of the power transmission so as to avoid overdrive or even damage. A coupling of the electronics arrangement in a circuit topology is advantageous. The coupling keeps the energy transmission signal of the first resonance frequency away from the components of the electronics arrangement (e.g., the LNA). Possible switching effects on the PIN diode of a detuning circuit may be avoided if there is a risk that the energy transmission signal has a switching effect of this type. The protective circuit may also be embodied so as to conduct electrical energy of the second resonance frequency around a detuning circuit. Detuning circuits of this type are used to avoid receiving magnetic resonance signals at a conductor loop, if the magnetic resonance signals are not needed.

The protective circuit includes at least one frequency-dependent protective impedance that is connected in parallel with the terminals and features a strong barrier effect with the second resonance frequency. With the first resonance frequency, the protective impedance is negligible so that a type of short-circuit is generated. Energy received at the first resonance frequency is routed around the terminals and consequently also the electronics arrangement. If necessary, the energy received at the first resonance frequency is routed around the detuning circuit. The energy transmission current is short-circuited in parallel with an entry of the electronics arrangement and the detuning circuit using a throttle. A series resonance circuit may also be used.

In one embodiment, receiving loops may be used in overlap areas, and the terminals of the electronics arrangement are not located in the overlap areas. A protective circuit of this type may not be needed, since the energy transmission signal is restricted to the receiving loops.

The local coil may also be embodied so as to transmit magnetic resonance signals (e.g., of the second resonance frequency). A transmit and receive local coil may consequently be configured in accordance with the present embodiments.

The present embodiments also relate to a magnetic resonance device including one embodiment of a local coil and an energy transmission device configured to send energy at the first resonance frequency. A coil may be used as an energy transmission device, the coil transmitting a corresponding signal suited to transmitting energy at the first resonance frequency. The signal is received by the conductor loop arrangement of the local coil and is suitably converted into an operating voltage by the converter apparatus. All embodiments discussed with respect to the local coil may similarly be applied to the magnetic resonance device, so that the same advantages are achieved.

In one embodiment, the magnetic resonance device may include a receiving device for magnetic resonance signals sent by a transmit device of the local coil and received by the local coil. These may, in accordance with a suitable preprocessing in the electronics arrangement, be transmitted at a frequency in the gigahertz range. A receiving device arranged upstream of the receive electronics of the magnetic resonance device may be provided so as to receive the magnetic resonance signals such that the magnetic resonance signals may be further processed in the receive electronics of the magnetic resonance device in order to generate a magnetic resonance image, for example.

In one embodiment, a high-frequency transmit coil (e.g., a body coil) of the magnetic resonance device may be embodied as an energy transmission device. An already available high frequency transmit coil may therefore also be embodied to transmit energy at the first resonance frequency so that no further coils or other energy transmission facilities are needed.

DETAILED DESCRIPTION OF THE DRAWINGS

Figure 1:
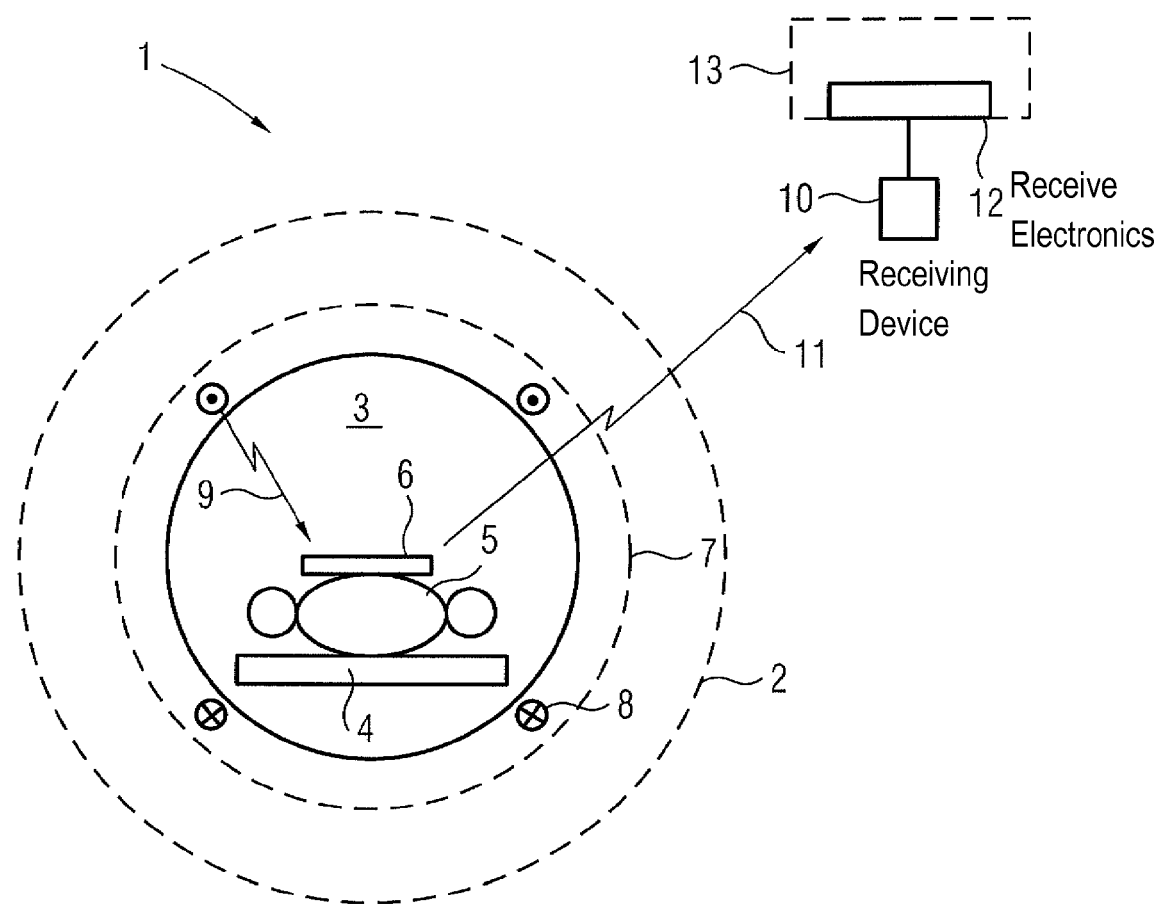
FIG. 1 shows one embodiment of a magnetic resonance device.

FIG. 1 shows a schematic diagram of a cross-section through one embodiment of a magnetic resonance device 1. FIG. 1 shows components relevant to the present embodiments. The magnetic resonance device 1 includes a patient receptacle 3 within a main magnet arrangement 2. A patient 5 may be moved into the main magnet arrangement 2 using a patient couch 4. One embodiment of a local coil 6 may be arranged on the patient 5, the local coil 6 including a double resonance conductor loop arrangement. Operating energy may be received at a first resonance frequency, and magnetic resonance signals may be received at a second resonance frequency. This is explained in more detail below. The mechanisms of the magnetic resonance are, however, largely known and are not described in more detail.

To be able to transfer the energy onto the local coil 6 at the first resonance frequency, the magnetic resonance device 1 includes an energy transmission device 7 that is realized, for example, as a body coil (e.g., indicated with element 8 in FIG. 1). An additional energy transmission coil or similar may also be provided. Operating energy is accordingly transferred by the energy transmission device 7 at the first resonance frequency (subsequently, also energy transmission frequency) to the local coil 6. The operating energy is received at the local coil 6 by the conductor coil arrangement (e.g., arrow 9). The local coil 6 also includes a transmit device, by way of which received magnetic resonance signals are transmitted to a corresponding receiving device 10 of the magnetic resonance device (e.g., arrow 11). Further processing of the magnetic resonance signals, which are received by the receiving device 10, may take place by way of receive electronics 12 that may be part of a control device 13 of the magnetic resonance device 1.

In order to maintain as little interference as possible in a range of the magnetic resonance frequencies (e.g., with the second resonance frequency), the first resonance frequency in the exemplary embodiment shown in FIG. 1 is at 5 MHz (e.g., synchronous with the system clock). The magnetic resonance signals are transmitted in a gigahertz range to the receiving device 10.

Figure 2:
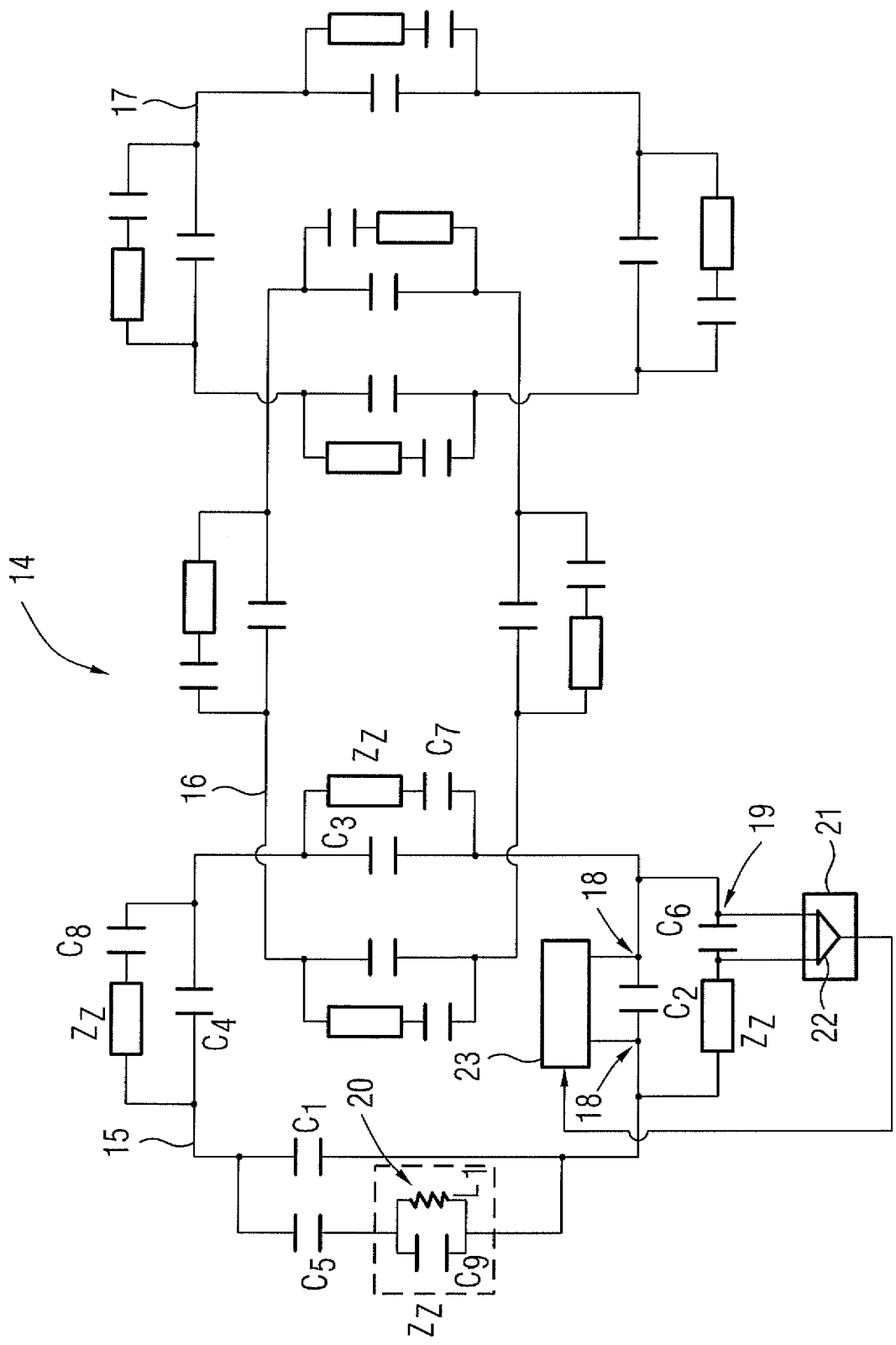
FIG. 2 shows one embodiment of a conductor loop arrangement.

The basis of the present embodiments is a double resonance conductor loop arrangement of the local coil 6. FIG. 2 shows one embodiment of a conductor loop arrangement 14 in the form of three conductor loops 15, 16 and 17. Terminals 18, 19 for deriving the signals are only shown in one conductor loop 15 for reasons of clarity. The terminals 18, 19 are provided on all the conductor loops 15, 16, 17. The conductor loop arrangement 14 of the local coil 6 may include further conductor loops 15, 16, 17, with local coils 6 including, for example, up to 100 or more conductor loops.

Each conductor loop includes shorting capacitors $C_1$-$C_4$. The shorting capacitors $C_1$-$C_4$ tune the conductor loops 15, 16 and 17 to the second resonance frequency (e.g., the magnetic resonance frequency). The parallel connection of a frequency-dependent additional impedance $Z_z$ and an additional capacitor $C_5$, $C_6$, $C_7$ and/or $C_8$ to the shorting capacitors $C_1$-$C_4$ is, however, provided in each case. The additional impedance $Z_z$ is configured such that the additional impedance $Z_z$ blocks in the case of the second resonance frequency and opens in the case of the first resonance frequency (i.e., the energy transmission frequency). The alternating current resistance is negligible. The additional capacitors $C_5$-$C_8$ are selected such that, together with the shorting capacitors $C_1$-$C_4$, the additional capacitors $C_5$-$C_8$ tune the conductor loops 15, 16, 17 to the first resonance frequency. Each of the conductor loops 15, 16, 17 is double resonant and may therefore receive signals at the first resonance frequency and the second resonance frequency.

The additional impedance $Z_z$, which, for the sake of clarity, is only shown at one point, is present in FIG. 2. The additional impedance $Z_z$ is configured as a parallel resonance circuit 20 with an inductor L and a capacitor $C_9$ such that the parallel resonance circuit 20 blocks at the magnetic resonance frequency (i.e., the second resonance frequency), which provides $$\omega_{MR} = \frac{1}{\sqrt{C_9 L_1}}.$$

Contrary to the alternative possibility of a coil as additional impedance $Z_z$, a lower inductor is provided for $L_1$ so that a lower loss small design is possible.

The signals received at the first resonance frequency and the second resonance frequency are derived by way of the terminals 18, 19. The signals of the first resonance frequency are fed to a converter apparatus 21 that generates a direct current as an operating voltage by way of a rectifier 22. The components supply an electronics arrangement 23 via the rectifier 22. The magnetic resonance signals are fed to the electronics arrangement 23 at the second resonance frequency.

Figure 3:
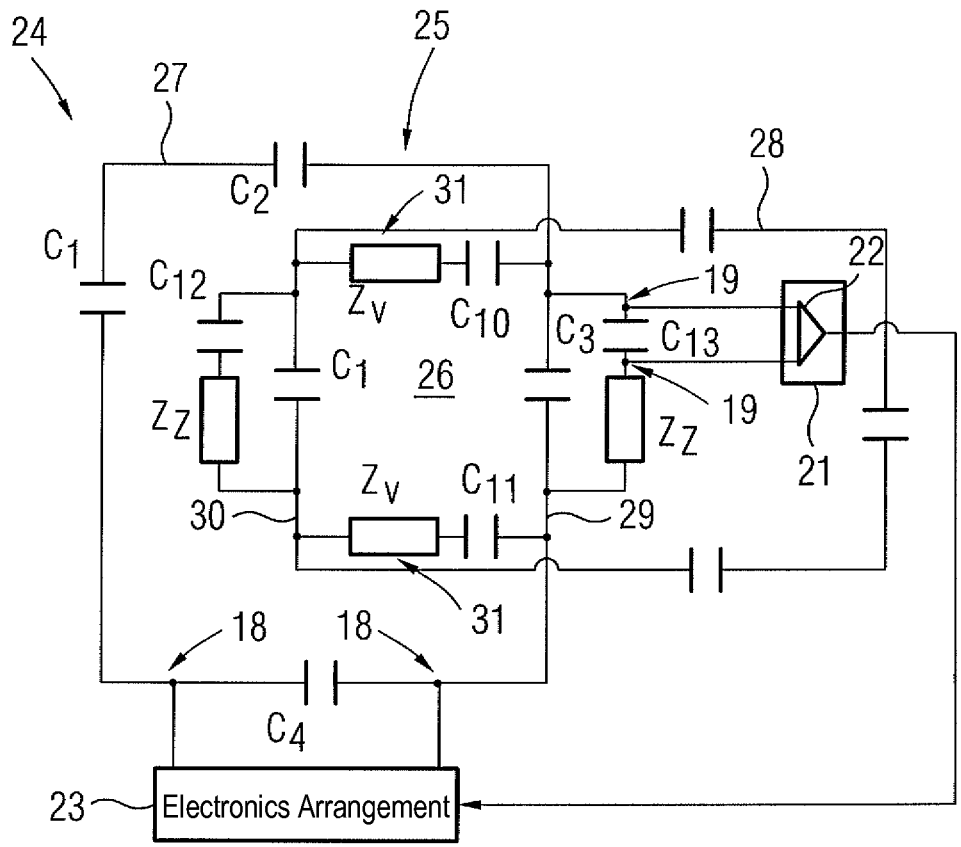
FIG. 3 shows another embodiment of a conductor loop arrangement.

FIG. 3 shows one embodiment of a conductor loop arrangement 24 of one embodiment of a local coil 6. A receiving loop 26 is created in an overlap area 25 in the conductor loop arrangement 24. The receiving loop 26 is configured to receive at the first resonance frequency. Only two conductor loops 27, 28 are shown for better clarity but more conductor loops may be provided. The conductor loops 27 and 28 overlap in the overlap area 25, so as to provide a decoupling with respect to the second resonance frequency. The conductor loops 27, 28 include shorting capacitors $C_1$-$C_4$ in order to tune the conductor loops 27, 28 to the second resonance frequency.

Coil conductors 29 and 30 run in parallel in the overlap area 25. The coil conductors 29, 30 are connected by two filter connections 31 such that the coil conductors 29, 30 produce the receiving loop 26. The filter connections 31 are composed of frequency-dependent connection impedances $Z_v$ and connection capacitors $C_{10}$ and $C_{11}$. The connection capacitors $C_{10}$ and $C_{11}$ act as shorting capacitors of the receiving loop 26. The connection impedance $Z_v$ is configured such that the connection impedance $Z_v$ acts as a barrier for the second resonance frequency, so that the receiving loop 26 is only visible for the first resonance frequency, which is used for the energy transmission. The alternating current resistance of the connection impedance $Z_v$ is negligible for the first resonance frequency.

Additional capacitors $C_{12}$ and $C_{13}$ that are connected in parallel with the shorting capacitors $C_1$ and $C_3$ of the coil conductors 29 and 30 also contribute to tuning the receiving loop 26 with respect to the first resonance frequency. Part of the parallel circuit is an additional impedance $Z_z$ that is blocked for the second resonance frequency and is negligible for the first resonance frequency. The capacitors $C_1$, $C_3$, $C_{12}$, $C_{13}$, $C_{10}$ and $C_{11}$ are used to attune the receiving loop 26 to the first resonance frequency. In other embodiments, additional impedance $Z_z$ and/or additional capacitors $C_{12}$ and $C_{13}$ may not be used.

While the conductor loops 27 and 28 are used to receive magnetic resonance signals at the second resonance frequency, at least one additional receiving loop 26 is created, by way of which the operating energy is received at the first resonance frequency. A double resonance conductor loop arrangement 24 is produced overall. The magnetic resonance signals are tapped by way of terminals 18 and fed to an electronics arrangement 23. The energy transmission signal is tapped by way of terminals 19 and fed to a converter apparatus 21 with a rectifier 22, where the operating voltage is generated for the components of the electronic arrangement 23.

The additional impedances $Z_z$ and the connection impedances $Z_v$ may be embodied as parallel resonance circuits 20, as was explained with regard to FIG. 2.

Additional receiving loops for the energy transmission are therefore created in the conductor loop arrangement 24 in the overlap area 25 by connecting coil conductors 29 and 30 to the filter connection 31 so that additional capacitors $C_{12}$ and $C_{13}$ and additional impedances $Z_z$ are at least not needed at each shorting capacitor $C_1$-$C_4$. In one embodiment, the additional capacitors and the additional impedances may be completely dispensed with. This realization of receiving loops (e.g., energy transmission antennas) in the overlap areas 25 also enables the receiving loops 26 to be spaced apart so as to reduce and/or avoid problems during the decoupling of the receiving loops 26 in the case of the first resonance frequency. The electronics of the electronics arrangement 23 are not exposed to the energy transmission signals.

Figure 4:
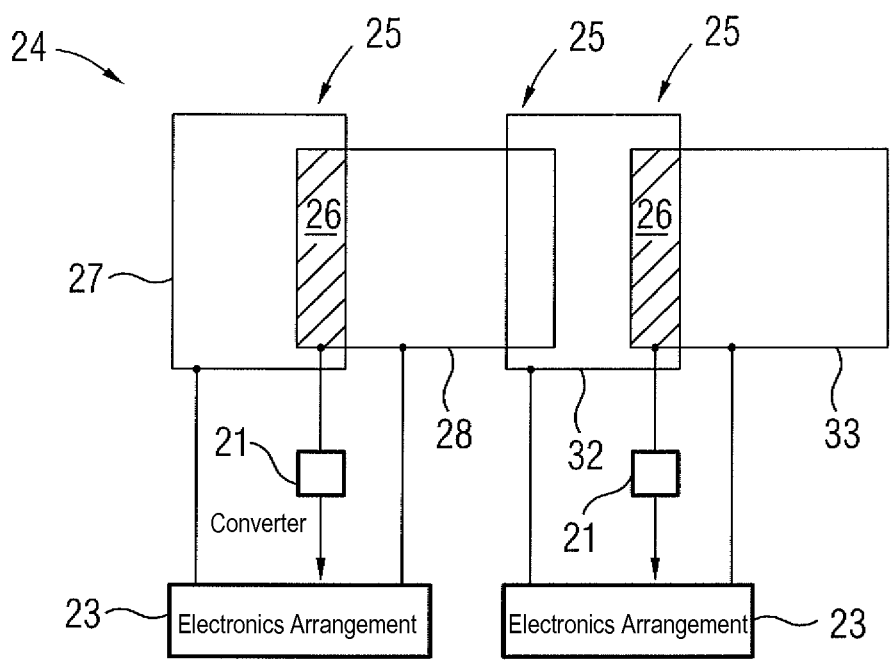
FIG. 4 shows a schematic diagram of the position of receiving loops.

With respect to avoiding coupling effects, each overlap area 25 may not be used to create a receiving loop 26, as is explained in more detail by the schematic diagram in FIG. 4. Four conductor loops 27, 28, 32, 33 of the conductor loop arrangement 24 are shown schematically in FIG. 4. Three overlap areas 25 exist, with the receiving loops 26 being created such that an overlap area 25 without receiving loop 26 is located therebetween.

Figure 5:
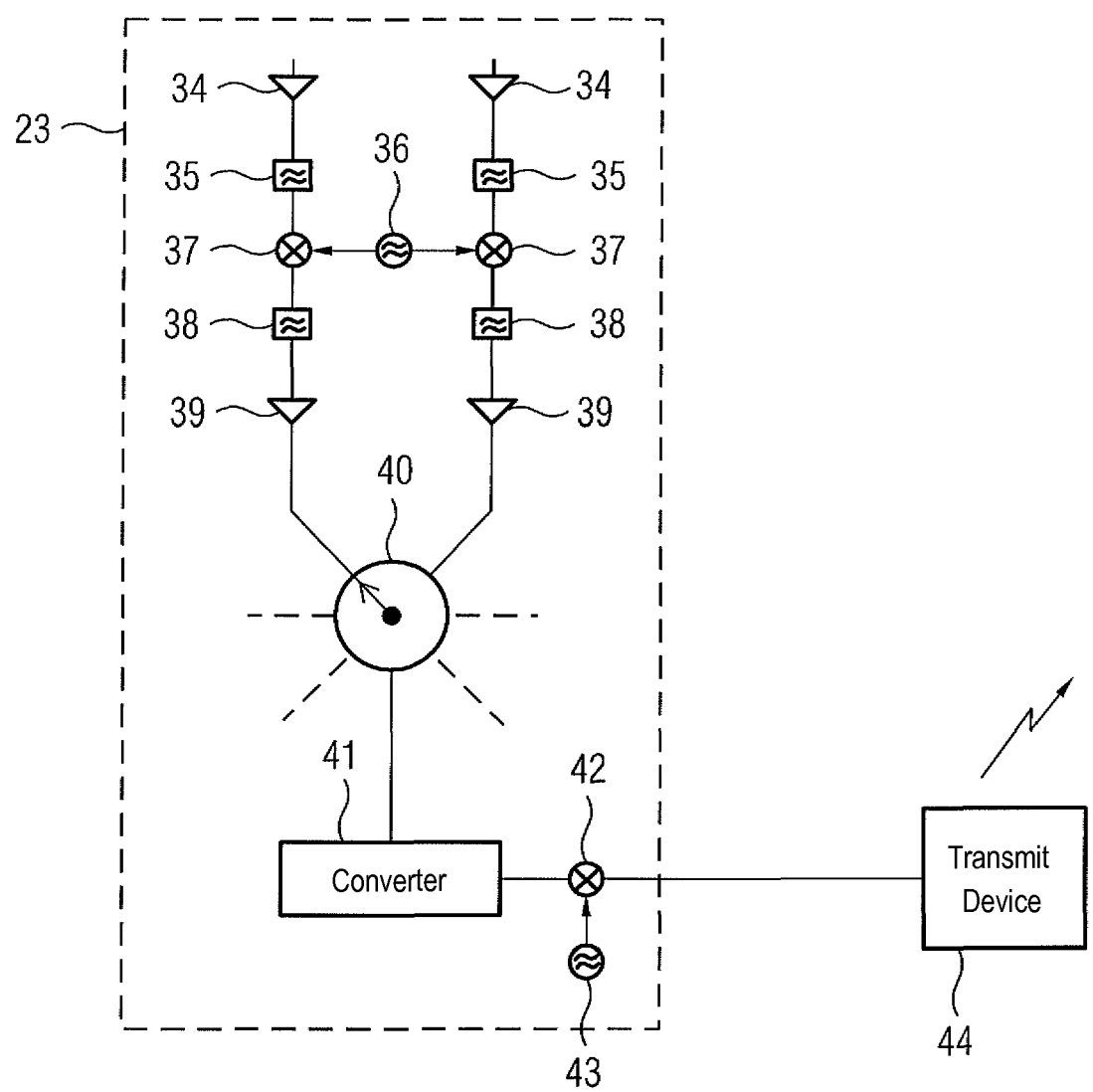
FIG. 5 shows an electronics arrangement of one embodiment of a local coil.

FIG. 5 shows one embodiment of an electronics arrangement 23. The electronics arrangement is configured to preprocess the received magnetic resonance signals. The processing of the signals of two conductor loops is shown. A low-noise preamplifier 34 followed by a filter 35 are used. Each of the two signals is brought to two different intermediate frequencies by using an oscillator 36 and a mixer 37, the two different intermediate frequencies enabling mutual forwarding. The two signals are forwarded to a multiplexer 40 (time-domain multiplexer) by way of a further filter 38 and an intermediate frequency amplifier 39, where the signals of other conductor loops (e.g., indicated by dashed feed lines) may be added thereto. An analog-digital converter 41 for digitalizing the signals is arranged downstream of the multiplexer 40. The signals are processed in a mixer 42 with an associated oscillator 43 so as to be digitally forwardable to the receiving device 10 (FIG. 1) by way of the corresponding transmit device 44 of the local coil 6 at frequencies in the gigahertz range.

Other and/or additional components may also form part of the electronics arrangement 23. The exemplary embodiment shown here is to be understood as purely exemplary.

Figure 6:
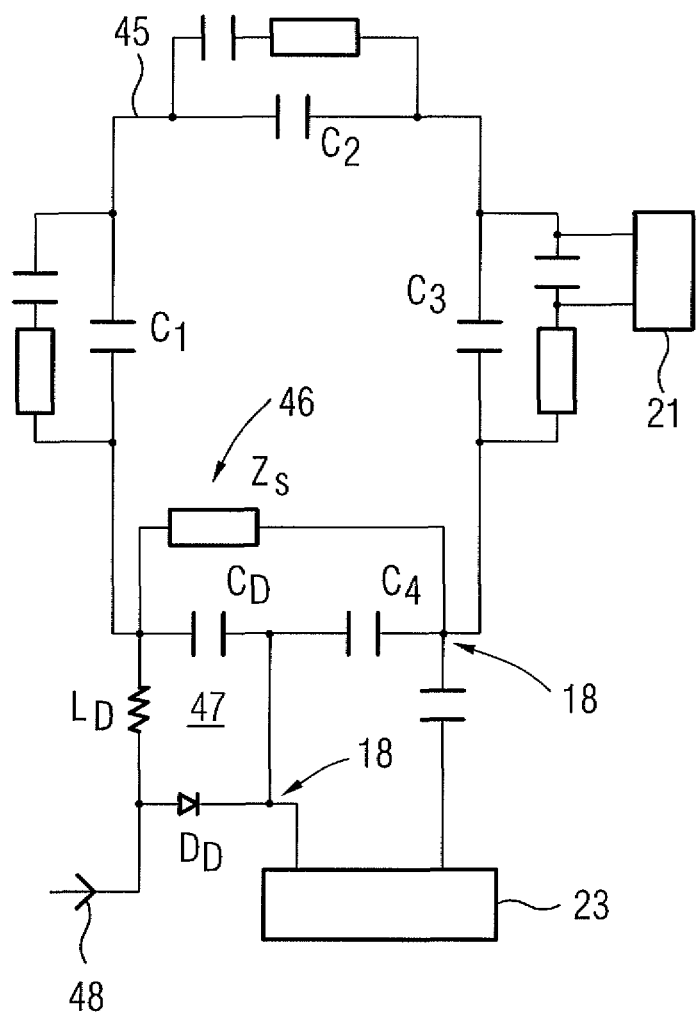
FIG. 6 shows a conductor loop of one embodiment of a local coil with a protective circuit.

FIG. 6 shows an example of a further conductor loop 45, for which a protective circuit 46 may be realized. The protective circuit 46 protects a detuning circuit 47 and the electronics arrangement 23 from the energy transmission signal. The detuning circuit 47 includes a PIN diode $D_D$. The PIN diode $D_D$ may be set by way of a corresponding detuning signal, indicated with 48. The detuning circuit 47 also includes a detuning inductance $L_D$ and a detuning capacitor $C_D$ that detune the conductor loop 45 for the second resonance frequency (i.e., the magnetic resonance frequency). A protective impedance $Z_S$, with respect to the detuning circuit 47 and terminals 18 may be provided. The protective impedance $Z_S$ blocks for the second resonance frequency and is negligible for the first resonance frequency in the manner of a short-circuit. The energy transmission signal of the first resonance frequency is therefore passed over the detuning circuit 47 and the terminals 18 for the electronics arrangement 23 so as not to expose the detuning circuit 47 and the terminals 18 to the energy transmission signal.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance device, the local coil comprising:
   a double resonance conductor loop arrangement comprising at least one conductor loop;
   a converter apparatus configured for converting operating energy received at a first resonance frequency into an operating voltage; and
   an electronics arrangement operated with the operating voltage, the electronics arrangement configured for processing magnetic resonance signals received at a second resonance frequency,
   wherein the at least one conductor loop includes at least one shorting capacitor, an additional capacitor and a frequency-dependent additional impedance being connected in parallel with the at least one shorting capacitor, so as to generate a double resonance, the frequency-dependent additional impedance having a barrier effect for one resonance frequency of the first resonance frequency and the second resonance frequency.

2. The local coil as claimed in claim 1, further comprising a transmit device configured to wirelessly transmit the magnetic resonance signals received at the second resonance frequency.

3. The local coil as claimed in claim 1, further comprising a parallel resonance circuit having a capacitor and an inductor as an additional impedance, a connection impedance, or the additional impedance and the connection impedance.

4. The local coil as claimed in claim 1, further comprising a protective circuit that conducts an electrical energy of the first resonance frequency around terminals so as to tap magnetic resonance signals of the second resonance frequency.

5. The local coil as claimed in claim 4, wherein the protective circuit comprises at least one frequency-dependent protective impedance that is connected in parallel with the terminals and blocks the second resonance frequency.

6. The local coil as claimed in claim 4, wherein the protective circuit is configured so as to conduct electrical energy of the second resonance frequency about a detuning circuit.

7. The local coil as claimed in claim 1, wherein the local coil is configured to transmit magnetic resonance signals.

8. The local coil as claimed in claim 7, wherein the local coil is configured to transmit magnetic resonance signals at the second resonance frequency.

9. The local coil as claimed in claim 1, wherein the converter apparatus comprises a rectifier configured for generating a direct current from the operating energy received at the first resonance frequency.

10. A local coil for a magnetic resonance device, the local coil comprising:
    a double resonance conductor loop arrangement comprising at least one conductor loop;
    a converter apparatus configured for converting operating energy received at a first resonance frequency into an operating voltage; and
    an electronics arrangement operated with the operating voltage, the electronics arrangement configured for processing magnetic resonance signals received at a second resonance frequency,
    wherein the at least one conductor loop comprises at least two conductor loops that overlap one another in an overlap area, and
    wherein, in the overlap area, adjacent coil conductors of two adjacent conductor loops of the at least two conductor loops are connected to a connection impedance that blocks the second resonance frequency and a connection capacitor using a filter connection, a receiving loop that is resonant for the first resonance frequency being formed in the overlap area by the adjacent coil conductors and the filter connection.

11. The local coil as claimed in claim 10, wherein an additional capacitor and a frequency-dependent additional impedance that features a barrier effect for the first resonance frequency or the second resonance frequency are connected in parallel with shorting capacitors provided in the adjacent coil conductors forming part of the receiving loop.

12. The local coil as claimed in claim 10, wherein with at least three overlap areas, receiving loops are only in one part of the at least three overlap areas, the at least three overlap areas comprising the overlap area.

13. The local coil as claimed in claim 12, wherein an overlap area of the at least three overlap areas without receiving loops is arranged between two of the receiving loops.

14. A magnetic resonance device comprising:
    a local coil comprising:
        a double resonance conductor loop arrangement comprising:
            at least one conductor loop;
            a converter apparatus configured for converting operating energy received at a first resonance frequency into an operating voltage; and
            an electronics arrangement operated with the operating voltage, the electronics arrangement configured for processing magnetic resonance signals received at a second resonance frequency; and
        a protective circuit that conducts an electrical energy of the first resonance frequency around terminals so as to tap magnetic resonance signals of the second resonance frequency; and
    an energy transmission device configured to emit energy at the first resonance frequency,
    wherein the protective circuit comprises at least one frequency-dependent protective impedance that is connected in parallel with the terminals and blocks the second resonance frequency.

15. The magnetic resonance device as claimed in claim 14, further comprising a receiving device for magnetic resonance signals transmitted by a transmit device of the local coil and received by the local coil.

16. The magnetic resonance device as claimed in claim 14, wherein the energy transmission device comprises a high frequency transmit coil.

17. The magnetic resonance device as claimed in claim 16, wherein the high frequency transmit coil comprises a body coil.

* * * * *